(12) United States Patent
Young et al.

(10) Patent No.: US 7,873,133 B2
(45) Date of Patent: Jan. 18, 2011

(54) RECOVERY OF CLIENT CLOCK WITHOUT JITTER

(75) Inventors: Scott A. Young, Scotts Valley, CA (US); Ting-Kuang Chiang, Saratoga, CA (US)

(73) Assignee: Infinera Corporation, Sunnyvale, CA (US)

( * ) Notice: Subject to any disclaimer, the term of this patent is extended or adjusted under 35 U.S.C. 154(b) by 790 days.

(21) Appl. No.: 11/426,481

(22) Filed: Jun. 26, 2006

(65) Prior Publication Data

US 2007/0001722 A1    Jan. 4, 2007

Related U.S. Application Data

(60) Provisional application No. 60/695,383, filed on Jun. 30, 2005.

(51) Int. Cl.
*H03D 3/24* (2006.01)

(52) U.S. Cl. .................. 375/376; 375/354; 327/141; 327/147; 327/156

(58) Field of Classification Search .................. 375/354, 375/376; 327/141, 147, 156
See application file for complete search history.

(56) References Cited

U.S. PATENT DOCUMENTS

| | | | |
|---|---|---|---|
| 4,654,864 A | 3/1987 | Ichiyoshi | |
| 5,093,847 A | 3/1992 | Cheng | |
| 5,579,351 A | 11/1996 | Kim | |
| 5,604,773 A | 2/1997 | Urala et al. | |
| 5,917,351 A * | 6/1999 | Shiue et al. | ............ 327/156 |
| 6,392,457 B1 | 5/2002 | Ransijn | |
| 6,441,655 B1 | 8/2002 | Fallahi et al. | |
| 6,538,520 B1 | 3/2003 | Merrill et al. | |
| 6,650,187 B1 | 11/2003 | Riddle et al. | |
| 6,650,721 B1 | 11/2003 | Janesch et al. | |
| 6,714,056 B2 * | 3/2004 | Fallahi et al. | ............ 327/115 |
| 6,738,922 B1 | 5/2004 | Warwar et al. | |
| 6,882,662 B2 | 4/2005 | Subrahmanyan et al. | |
| 7,162,002 B2 * | 1/2007 | Chen et al. | ............ 375/376 |
| 7,366,270 B2 * | 4/2008 | Tang et al. | ............ 375/372 |
| 7,496,168 B2 * | 2/2009 | Leonowich et al. | ......... 375/376 |
| 2002/0075980 A1 | 6/2002 | Tang et al. | |
| 2003/0231069 A1 | 12/2003 | Chiang et al. | |
| 2004/0022303 A1 | 2/2004 | Tonietto et al. | |
| 2004/0042500 A1 | 3/2004 | Christiansen | |
| 2004/0052528 A1 | 3/2004 | Halgren et al. | |
| 2004/0196940 A1 | 10/2004 | Chien | |
| 2005/0084051 A1 | 4/2005 | Nauta et al. | |
| 2005/0117585 A1 | 6/2005 | Linkewitsch et al. | |

* cited by examiner

*Primary Examiner*—David C Payne
*Assistant Examiner*—Leon Flores
(74) *Attorney, Agent, or Firm*—W. Douglas Carothers, Jr.; Ross M. Carothers

(57) ABSTRACT

The present invention provides a system, apparatus and method for recovering a client signal clock. The present invention is able to more effectively remove jitter within a clock signal by providing a phase shifting element in the feedback of a PLL system to compensate for sudden changes in an input reference clock. The PLL system provides flexible clock recovery so that it can accommodate various payload types because it extracts a client clock signal independent of a corresponding justification count number.

11 Claims, 3 Drawing Sheets

RECOVERY OF CLIENT CLOCK WITHOUT JITTER

CROSS REFERENCE TO RELATED PATENT APPLICATIONS

This application claims priority to U.S. Provisional Application Ser. No. 60/695,383, entitled "Recovery of Client Clock without Jitter," filed Jun. 30, 2005, which application is incorporated herein by reference in its entirety.

BACKGROUND

A. Technical Field

This invention relates to phase-locked loop ("PLL") systems, and more specifically, to the removal of jitter in the PLL output during the synthesis of certain clock signals in PLL systems.

B. Background of the Invention

Digital communication systems are now widespread, providing data conduits for numerous data types being transmitted from a source to a client over a network comprising one or more of these transmitter/receiver links or nodes. In order to accurately reconstruct the transmitted data at the client end, it is desirable to reproduce the client signal clock; the original data clock supplied to the network at the source end of the transmission link. In this way, time based data will be preserved at the client end. For example, if voice service is being transmitted, the signal can be spliced back together in a time-based cohesive manner with the use of an extracted client signal clock such that no dropouts occur at the client end. Other transmitted forms of data types which utilize an extracted client signal clock at the receiving client end include, but are not limited to, compressed voice technology, facsimile transmission, digital video transmission, and other quality of service based data types.

In the prior art, phase-locked loop ("PLL") systems are used to extract the desired client signal clock. Turning to FIG. 1, a conventional PLL system 100 is shown. The purpose of the PLL system 100 is to provide an output clock frequency 160 which is proportional to an input reference clock frequency 110. As the input reference clock frequency 110 changes, the PLL 100 will track the change such that the output clock frequency 160 changes proportionally to the input reference clock 110.

A second order conventional PLL system includes a phase detector 120, a loop filter 130 and a voltage controlled oscillator 140 ("VCO"). The output $f_{out}$ of the VCO 140 provides feedback to the phase frequency detector 120 or comparator, as part of the PLL system, and is compared with an input reference signal $f_{ref}$ 110 by the phase detector 120, which results in an error signal. The error signal is representative of the phase or frequency difference between the two signals, $f_{out}$ and $f_{ref}$. The error signal is then feed to the loop filter 130 via one of two signals, $+f_{vco}$ or $-f_{vco}$. For example, if the proportional frequency of the output signal $f_{out}$ is lagging the input reference signal $f_{ref}$, then the error signal $+f_{vco}$ is provided to the VCO 140 to command the VCO 140 to increase the output frequency of $f_{out}$ to track, or otherwise proportionally change with respect to, the input reference signal $f_{ref}$. The loop filter 130 is a low pass filter which filters out higher frequencies and provides at its output a frequency control signal to the VCO 140.

In many applications, it is undesirable to have the input reference signal $f_{ref}$ and the output signal $f_{out}$ at the same frequency and, thus, the signals are scaled. As shown, the feedback signal $f_{out}$ is scaled by a factor M 150 and the input reference signal $f_{ref}$ is scaled by a factor of N 115. This results in the following relationship between the output signal $f_{out}$ and the input signal $f_{ref}$:

$$f_{out} = \frac{M}{N} \cdot f_{ref} \quad (1)$$

A problem with the use of the above relationship (1) in conventional PLL systems in the extraction of the end client signal clock is that they are susceptible to large changes in the input reference signal $f_{ref}$. A conventional PLL as described herein is sensitive to sudden changes in the reference signal $f_{ref}$ resulting in excessive frequency and phase variations which can cause the end terminating client receiver to slip bits. Such fast changes cannot be adequately filtered out resulting in jitter or wander at the output signal $f_{out}$. If severe, such jitter or wander can cause end receivers to lose lock on the client signal, resulting in dropouts, apparent in intermediate audible clicks in voice service data for example.

Under certain circumstances, delivering specific types of payloads one can use the justification count ("JC") of a payload digital wrapper to correct for excessive frequency and phase variations. AMCC or G.709 specifications, for example, constrain the JC value to +/−1, since such systems only support +/−1 JC. This may not lead to an undesirable jitter problem. In the client receiving end node the plus or minus one clock represented by the JC value can be interpolated over an entire frame. Since each frame of data is thousands of bytes in length, the frequency shifting of one clock cycle over the entire frame by the PLL system will result in minimal jitter.

However, one problem in the foregoing scheme is that the resulting system is limited in use, being able to adequately transmit payloads of certain configurations, where the JC is +/−1 for example, while not being suitable for the transmission of other payloads. Furthermore, the foregoing scheme offers little scalability with regards to newer network configurations relying on new data frame formats which may require justification count values in the thirties or higher.

SUMMARY OF THE INVENTION

The present invention provides a system, apparatus and method for providing for recovering a client signal clock. The present invention is able to more effectively remove jitter within a clock signal by providing a phase shifting element in the feedback of a PLL system to compensate for sudden changes in an input reference clock. The PLL system provides flexible clock recovery so that it can accommodate various payload types because it extracts a client clock signal independent of a corresponding justification count number.

In various embodiments of the invention, a client signal clock is recovered from a digital wrapper that is port of a network data stream. A phase shifting element is provided within the feedback of a PLL which receives a justification count and buffer depth in order to compensate for sudden changes in the input reference clock entering the PLL. This justification count is used to generate a frequency offset that may be applied to the carrier frequency of the digital wrapper such that the client signal clock associated with the wrapper is recovered. In particular, sudden changes in the input reference clock may prevent accurate clock recovery by the PLL; however, the application of the frequency offset is used to compensate for these sudden changes and allow a more accurate clock recover.

It various embodiments of the invention, a client signal clock is recovered from a digital wrapper as part of a network data stream at a signal end node irregardless of the justification count value associated with the received data. As a result, the quality of the client signal clock is independent of the value of the justification count.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

Figure 1:
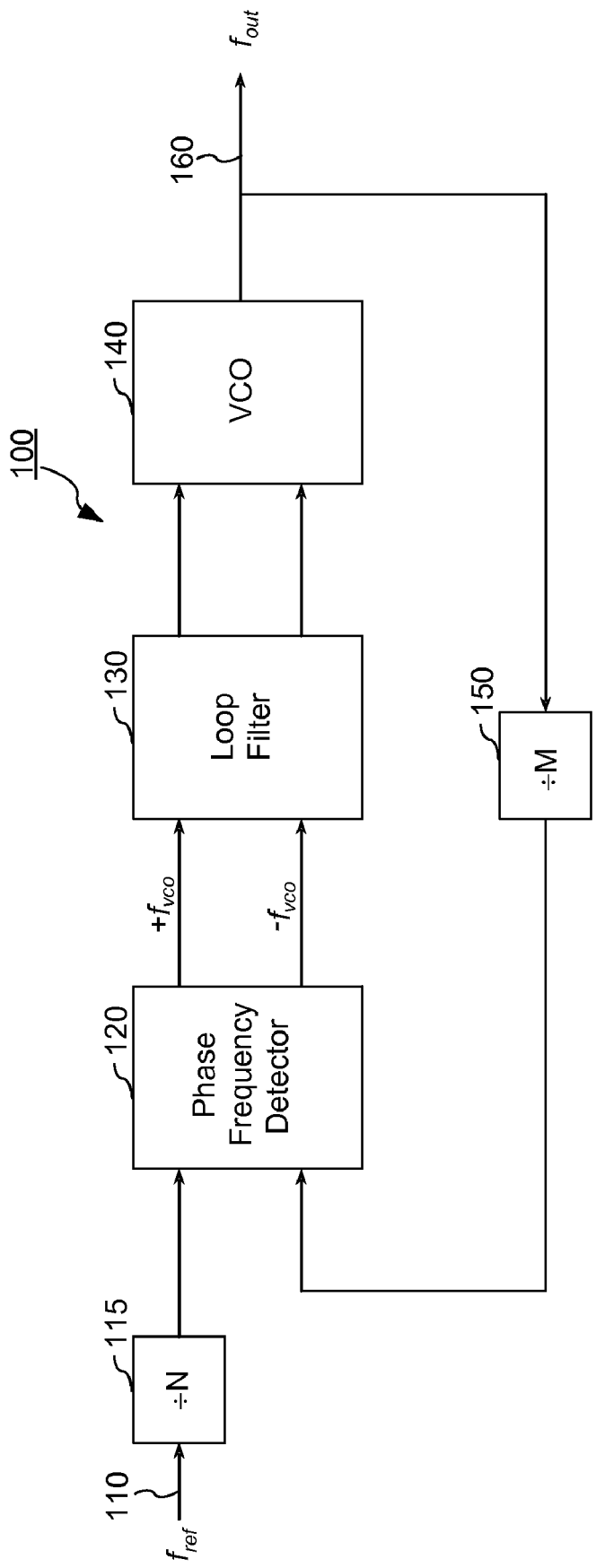
FIG. 1 illustrates a second-order phase-locked loop system.

The present invention provides a system, apparatus and method for recovering a client signal clock. The present invention is able to more effectively remove jitter within a clock signal by providing a phase shifting element in the feedback of a PLL system to compensate for sudden changes in an input reference clock. The PLL system provides flexible clock recovery so that it can accommodate various payload types because it extracts a client clock signal independent of a corresponding justification count number.

The following description is set forth for purpose of explanation in order to provide an understanding of the invention. However, it is apparent that one skilled in the art will recognize that embodiments of the present invention, some of which are described below, may be incorporated into a number of different computing systems and devices. The embodiments of the present invention may be present in hardware, software or firmware. Structures and devices shown below in block diagram are illustrative of exemplary embodiments of the invention and are meant to avoid obscuring the invention. Furthermore, connections between components within the figures are not intended to be limited to direct connections. Rather, data between these components may be modified, re-formatted or otherwise changed by intermediary components.

Reference in the specification to "one embodiment", "in one embodiment" or "an embodiment" etc. means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

From the optical link of the end node, a digital wrapper of the client data is received at a given carrier frequency, $f_{carrier}$. The timing information associated with the client signal can be extracted from the digital wrapper by scaling the carrier frequency and then subtracting that portion which is associated with the justification count, or JC. This concept can be mathematically expressed as follows:

$$f_{payload} = f_{carrier}\left(\frac{F_{bytes} - O_{bytes} - JC_{avg}}{F_{bytes}}\right) \quad (2)$$

Where: $f_{payload}$ is the frequency of the client signal;
$f_{carrier}$ is the carrier frequency extracted from the digital wrapper;
$F_{bytes}$ is the number of bytes in a frame of data;
$O_{bytes}$ is the number of Other bytes in the frame of data; and
$JC_{avg}$ is the average justification count.

The Other bytes ($O_{bytes}$) in equation (2) include overhead (OH), forward error correction (FEC) information and frame padding to create a desired frame size, otherwise referred to as Stuff bytes. For more detailed information regarding the digital wrapper frame structure as discussed herein, see U.S. patent application Ser. No. 10/715,947, filed Nov. 18, 2003, entitled "Optical Transmission Network with Asynchronous Mapping and Demapping and Digital Wrapper Frame for the Same," and U.S. patent application Ser. No. 11/154,455, filed Jun. 16, 2005, entitled "Universal Digital Framer Architecture for Transport of Client Signals of Any Client Payload and Format Type," both of which are incorporated herein by reference.

Since the carrier frequency, frame bytes and Other bytes are constant, the equation can be rewritten as follows:

$$f_{payload} = f_{carrier}\left(\frac{F_{bytes} - O_{bytes}}{F_{bytes}}\right) - f_{carrier}\left(\frac{JC_{avg}}{F_{bytes}}\right) \quad (3)$$

Thus, from equation (3) above, one can see that the client or payload frequency is represented by the difference of two terms, the first term equal to the carrier frequency scaled by a factor related to the amount of OH/FEC/Stuff bytes which exist and the total number of bytes in the frame. The second term is that portion of the carrier frequency associated with the JC of the frame and represents the amount of phase shift which must occur in order to recover the original client or payload frequency. The first term of the above equation provides for a coarse adjustment of the carrier frequency to a value near the desired payload frequency, while the second term provides for fine adjustments of the coarse clock to get the actual value of the client or payload clock frequency.

The above equation can be carried out by use of a conventional PLL system with the addition of a phase shifter applied at its output, $V_{out}$, the PLL scaling the carrier frequency while the phase shifter taking into account the JC of the frame. However, such a system is undesirable since the recovered clock may have a high incidence of jitter due to the phase shifter.

In accordance with the present invention, the phase shifter is operably placed in the feedback loop of a conventional PLL circuit to recover the client signal clock from a digital wrapper frame while eliminating jitter associated with the phase shifter itself.

Figure 2:
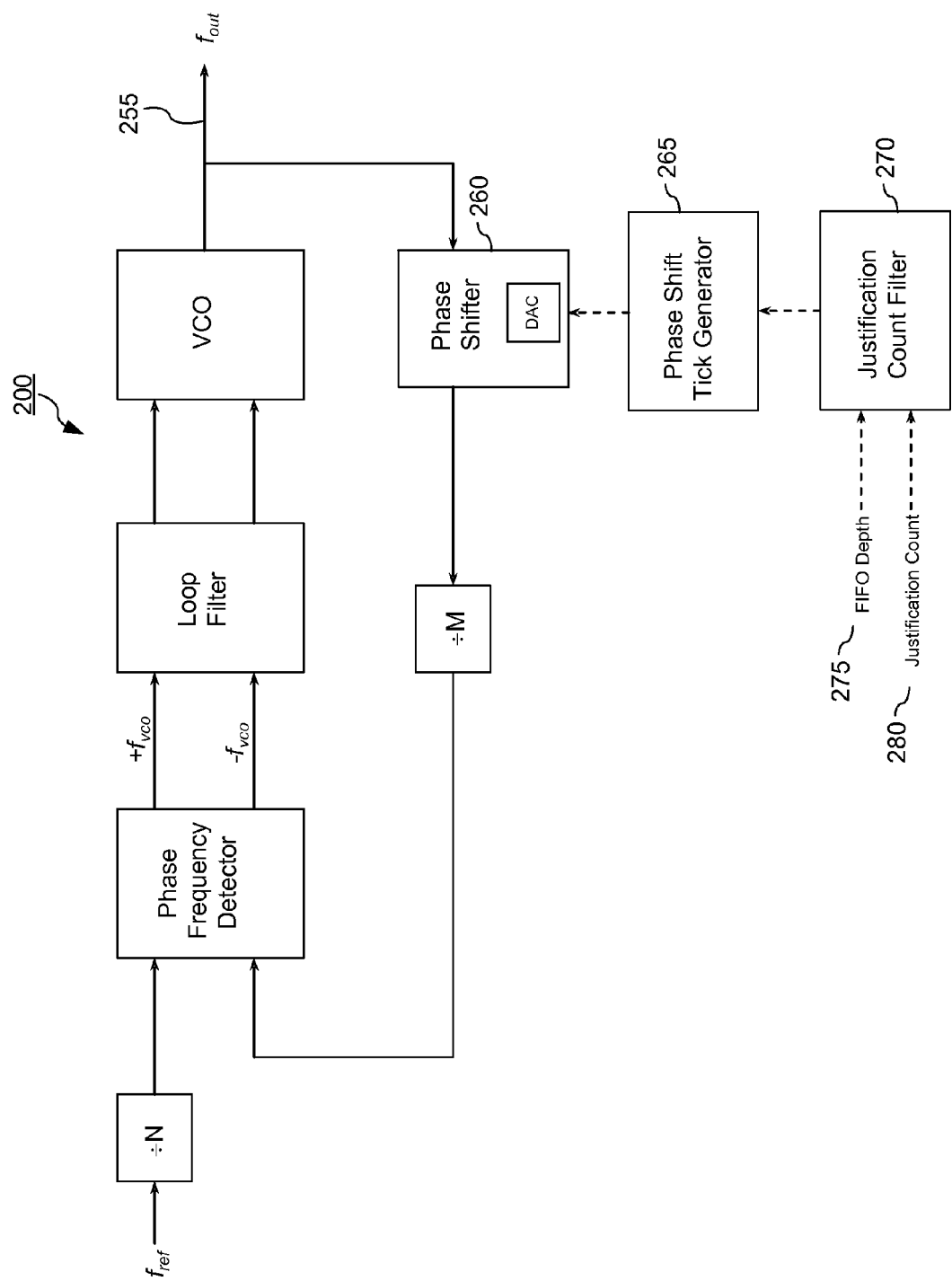
FIG. 2 illustrates a phase-locked loop having a phase shifter according to various embodiments of the invention.

Now turning to FIG. 2, a new PLL system 200 in accordance with the present invention will be discussed in greater detail. As shown, a phase shifter 260 is inserted in the feedback loop of the PLL system 200. The recovered client clock is phase shifted according to the justification count information 280, as discussed above, to represent the clock rate of the effective payload being transported within the digital wrapper. In such a configuration, with the phase shifter output being feed into the phase detector of the PLL, the PLL acts as a jitter filter resulting in very little jitter as part of the client signal clock.

As stated above, the PLL locks onto a scaled factor of the carrier frequency. While the scaled factor is discussed as being known or constant, or perhaps programmable, it is important to note that these values can change from time to time by various governing bodies to support new frame definitions. For example, the Stuff bytes may be increased or decreased as appropriate to handle new frame size limitations. Therefore, in accordance with the invention, the PLL system 200 of FIG. 2 handles the frequency conversion between the carrier frequency and the client signal frequency, and the filtering, or otherwise suppression, of jitter generated by the phase shifter 260. In order to adequately suppress jitter the PLL system 200 should have very low loop bandwidth and very low jitter generated by the PLL itself.

Each increment or decrement in the JC is associated with a certain number of phase shift events depending on the resolution of the phase shifter 260. As shown in FIG. 2, the JC is filtered by a JC filter 270 so that the fluctuation of the JC 280 from frame to frame is averaged. The number of phase shift events from frame to frame is low-pass filtered. The phase shift tick generator 265 then evenly distributes the phase shift events within each frame, minimizing any sudden phase shift events which could lead to jitter or wander in the output $f_{out}$ 255. These two blocks are used to make the phase shifting as smooth as possible so that the residual jitter through the PLL 200 is minimized.

In a preferred embodiment, the phase shifter 260 itself is a quadrature phase shifter which utilizes an internal 90 degree phase shifter to generate the in-phase clock (I-clock) and quadrature-phase clock (Q-clock). Preferable, the phase shifter 260 comprises 12-bit digital to analog (DAC) converters, providing a minimum phase step smaller than $\frac{1}{1024}$ or a clock period, although any suitable DAC resolution meeting the requirements discussed herein may be used. For example, if the clock frequency is 155 MHz, the resulting minimum phase shift step of a 12-bit DAC would be around 6 ps. In any rate, the phase shift step should be small enough for the stable operation of the main PLL, without excessive jitter or wander.

While the phase shifter 260 is described as being a quadrature phase shifter, any suitable phase shifter can be utilized as long as the phase shift step is small enough to minimize jitter. For example, a PLL-based phase shifter typically is capable of generating a phase step of $\frac{1}{16}$ or $\frac{1}{32}$ of a clock period. If the clock frequency is 155 MHz, the resulting minimum phase step would be around 200 ps. This phase step might be too large for the main PLL system to handle with regards to jitter. A PLL-based phase shifter would be acceptable if the operating frequency were high enough such that the jitter was minimized.

As discussed above, the JC value is averaged. The justification count filter 270 is used to average, or otherwise smooth out fluctuations of, JCs from frame to frame. The JC filter 270 internally accumulates a number K of distinct frames of JC information 280, defined as the JC of a "super frame." For example, with a frame rate of 21.26 kHz, providing a frame period of about 47.04 μs, a super frame time period is defined as 47.04*K μs. The summation of previous L super frames is used to determine the total number of phase shift events needed for this super frame period.

The super frame size K, should be chosen so that the super frame period is at least longer than the time constant of the main PLL system. The number of super frames used in averaging, L, should be equal to the number of phase shift steps that will shift the clock by the amount equivalent to two bytes of payload data per frame of data. For example, if the PLL loop bandwidth is around 50 Hz, the super frame size, K, should be at least 512. The phase step number, L, has to be at least 1024 in order to keep the phase step close to 6 ps. It is preferable to have L even larger than 1024.

While the invention has been disclosed in terms of using the justification value to determine and provide a phase shift to the output of the main PLL to recover a client clock signal, other frame information can be included in such a determination. In this way, the digital wrapper acquisition system can react to its "overall system health" and manipulate the rate at which the phase shifter operates on the output $f_{out}$ 255 of the PLL 200. For example, under certain circumstances wander may accumulate in the system and, ultimately, must be absorbed by the demapping framer FIFO (not shown). In order to eliminate errors associated with FIFO overflow or underflow conditions, the FIFO depth information 275 can be applied as an input to the justification count filter as shown. In this way, if the FIFO depth 275 is outside of a programmable or desired operating range, the phase shifting can be accelerated to bring the FIFO depth 275 within operating range.

Figure 3:
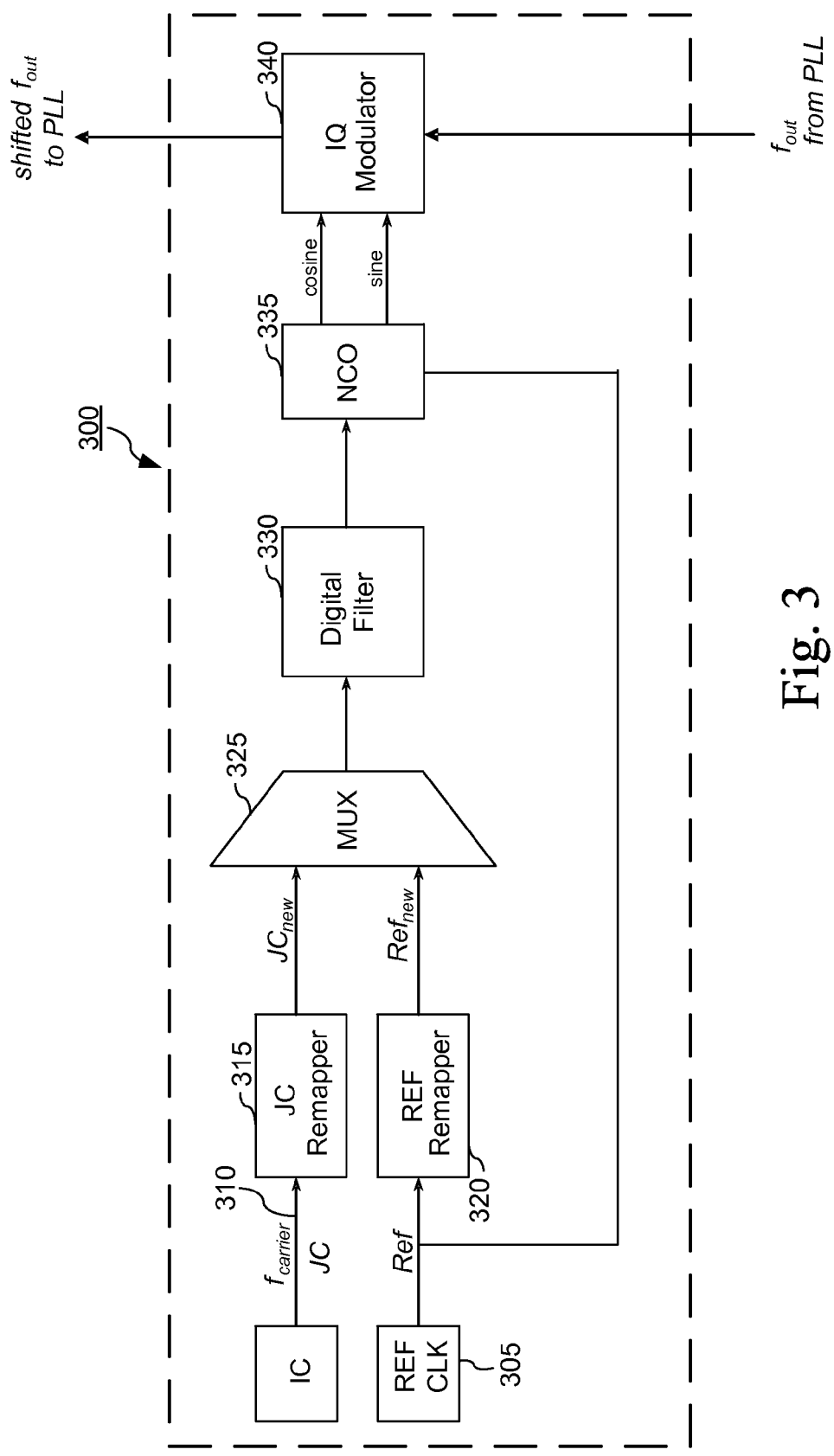
FIG. 3 illustrates a phase shifter system according to various embodiments of the invention.

Now turning also to FIG. 3, a phase shifter system 300 in accordance with one embodiment of the present invention is described in greater detail. FIG. 3 depicts the system functional block diagram of the phase shifter, comprising an interface to two input signals and associated remapping electronics, a multiplexer 325, a numerical controlled oscillator ("NCO") 335 and an IQ modulator 340. As discussed above, the quadrature phase shifter takes the output from the main PLL and phase shifts the signal based upon the quadrature cosine and sine inputs and feeds the resulting signal back to the phase frequency detector or comparator of the PLL, as shown.

The source of a first of the two input signals is obtained from an integrated circuit (IC) 310 and is based on the carrier frequency and JC count of the current frame, as part of the digital wrapper. To standardize the clock domains within the system, the signal is remapped by the JC remapper 315 to a new JC value, $JC_{new}$, and fed to the multiplexer 325. Such standardization may be unnecessary depending on the specific clock configuration requirements of the system. $JC_{new}$ is representative of the amount of phase shift to apply to the PLL output to recover the client clock.

The source of the second of the two input signals is an onboard reference clock 305 which is then remapped using a REF remapper 320 to a new reference signal $Ref_{new}$, which is close in characteristics, however not necessarily exact, to the newly mapped JC signal discussed immediately above, and then fed as a second input to the multiplexer 325. The multiplexer 325 is then used to select one of the two signals for delivery to the digital filter 330 whose output controls the NCO 335 sinusoidal output which ultimately controls the IQ modulator 340.

In normal operation, the $JC_{new}$ signal is switched through the multiplexer 325 to the digital filter 330. As stated above, the remapped $JC_{new}$ value is fed to the digital filter 330, which acts as a moving average filter to remove jitter and wander, resulting in an average JC value $JC_{avg}$ which is then used to drive the NCO 335. More specifically, the $JC_{avg}$ signal is fed to the NCO 335 which then outputs the sinusoidal signals to the IQ modulator 340 to achieve the desired phase shift. That is, the frequency of the NCO output will shift the input clock, $f_{out}$, by the NCO output frequency. Thus, the justification count is utilized to calculate an offset frequency and the phase shifter rotates the $f_{out}$ clock signal to obtain a frequency shift corresponding to the offset frequency. This signal is then fed back to the phase frequency detector which drives the VCO output toward the desired client signal clock frequency.

However, if for some reason the $JC_{new}$ signal cannot be accurately produced due to degradation of one or more parameters used by the integrated circuit 310 which provides the source of $JC_{new}$, or otherwise a synchronization failure of the current data frame has occurred, the system can switch the multiplexer input to the reference signal $Ref_{new}$ allowing the system to continue to acquire data while reacting to and correcting the $JC_{new}$ calculation. It is important to note that the reference signal Ref is derived in the digital wrapper acquisition systems and, therefore, is always present and able to take the place of $JC_{new}$ whenever needed. Since the reference signal is in a standby mode and used only when the $JC_{new}$ signal is unobtainable, the reference signal may be referred to as $JC_{standby}$.

It should be apparent to those skilled in the art that, while the invention has been described in terms of utilization of a phase shifting element in the feedback loop of the PLL, other suitable elements which perform the same end result as the phase shifting element may be employed. For example, a tunable signal generator may be operably placed within the feedback loop of the PLL, the programmable generator providing a desired output to the phase frequency detector representative of the desired frequency offset, as representative by the JC of the frame as described herein, which will result in the attainment of the client signal clock at the output of the PLL.

In a still further example, the desired offset frequency derived above, which the JC average part, which is the variable part of the formula, can be provided to a variable frequency generator which can directly generate the client signal from the offset part plus the Other bytes part of the formula, which is the constant part of the formula, to directly produce the client signal frequency. This embodiment will significantly reduce the amount of circuitry required to accurately reconstitute the client clock signal compared to the principal embodiment discussed previously in this application. This approach in recovering the client clock without jitter is a next generation implementation.

The foregoing description of the invention has been described for purposes of clarity and understanding. It is not intended to limit the invention to the precise form disclosed. Various modifications may be possible within the scope and equivalence of the appended claims.

We claim:

1. A phase-locked loop system comprising:
   a phase frequency detector configured to receive a reference frequency and compare the reference frequency to a feedback frequency and generate an error signal based on the comparison;
   a filter configured to receive the error signal and remove frequencies above a threshold value that are present in the error signal and output a frequency control signal;
   an oscillator configured to receive the frequency control signal and generate an output frequency signal representative of a first phase offset between the reference frequency and the feedback frequency; and
   a phase shifter configured to use a ninety degree phase shift to generate an in-phase clock and a quadrature-phase clock, the phase shifter further configured to receive the output frequency signal and adjust the output frequency signal relative to a second phase offset that is associated with an average phase error across a plurality of frames, each of the plurality of frames including a payload, the phase shifter including a digital-to-analog converter such that the phase shifter provides a minimum phase shift step smaller than a clock period of a clock rate of the payload.

2. The system of claim 1 wherein the digital-to-analog converter is a 12-bit converter.

3. The system of claim 1 wherein the phase shifter receives an averaged justification count value to determine a phase shift for the output frequency signal.

4. The system of claim 1 wherein a FIFO depth is provided to the phase shifter so that phase shifting may be adjusted to bring the FIFO depth within a preferred range.

5. The system of claim 1 wherein the phase-locked loop is located within a node in an optical long-haul transmission system.

6. The system of claim 1 wherein the oscillator is a voltage-controlled oscillator.

7. The system of claim 1 further comprising:
   a first-in-first-out (FIFO) buffer, the FIFO buffer providing a FIFO depth value indicative of the amount of data stored in the FIFO buffer;
   a justification count filter having a first input for receiving a corresponding one of a plurality of justification count values and a second input for receiving the FIFO depth value, the justification count filter configured to accumulate the plurality of justification count values and calculate an average justification count; and
   a phase shift tick generator, the second phase offset including a plurality of phase shift events, the phase shift tick generator configured to accept the average justification count and distribute the plurality of phase shift events to the phase shifter in response to the average justification count, the phase shifter configured to adjust the output frequency signal in response to each of the plurality of phase shift events.

8. The system of claim 7 wherein the plurality of phase shift events is evenly distributed within the first of the plurality of frames.

9. A method for recovering a clock signal comprising:
   comparing a reference frequency to a feedback frequency;
   generating an error signal based on the comparison of the reference frequency to the feedback frequency;
   removing frequencies above a threshold value that are present in the error signal and generating a frequency control signal;
   generating an output frequency signal based on the frequency control signal;
   shifting the frequency control signal by a phase that is determined according to a phase offset that is indicative of an average phase error across a plurality of data frames and a first-in-first-out (FIFO) buffer depth value in which information from the plurality of data frames is stored;
   receiving a plurality of justification counts associated with a payload of a first of the plurality of frames;
   averaging the plurality of justification counts in order to calculate an average justification count value; and
   distributing a plurality of phase shift events, derived from the average justification count value, across the first of the plurality of frames.

10. The method of claim 9 wherein a voltage-controlled oscillator generates the output frequency signal.

11. The method of claim 9 wherein the plurality of phase shift events are evenly distributed across the first of the plurality of frames.

* * * * *